United States Patent [19]

Cohen et al.

[11] Patent Number: 5,326,016
[45] Date of Patent: Jul. 5, 1994

[54] METHOD FOR REMOVING ELECTRICAL COMPONENTS FROM PRINTED CIRCUIT BOARDS

[76] Inventors: Marvin S. Cohen, 22 Lancaster Dr.; Marcio A. Lopes, 10 Second St., both of Framingham, Mass. 01701

[21] Appl. No.: 47,024

[22] Filed: Apr. 15, 1993

[51] Int. Cl.$^5$ .................. B23K 1/00; B23K 1/018
[52] U.S. Cl. .................... 228/264; 228/119; 228/191
[58] Field of Search .............. 228/264, 191, 119

[56] References Cited

U.S. PATENT DOCUMENTS 3,210,182  10/1965  Funari ..................... 228/264

FOREIGN PATENT DOCUMENTS 1263459  10/1986  U.S.S.R. ..................... 228/264

OTHER PUBLICATIONS

Baron and Chirino, *IBM Tech. Discl. Bull.*, vol. 19, No. 3 (Aug. 1976) p. 834.
Ward, *IBM Tech. Discl. Bull.*, vol. 19, No. 7 (Dec. 1976) p. 2476.
Getten, *IBM Tech. Discl. Bull.*, vol. 21, No. 12 (May 1979) p. 4790.
W. C. Ward, "Low–Melt Solder Alloy ..." *Electronic Packaging and Production*, vol. 17, No. 5 (May 1977) pp. 98–102.

*Primary Examiner*—P. Austin Bradley
*Assistant Examiner*—Jeffrey T. Knapp
*Attorney, Agent, or Firm*—John E. Toupal; Harold G. Jarcho

[57] ABSTRACT

A method for removing an individual surface mounted electrical component from a printed circuit board retaining a plurality of other components. The individual component has a plurality of leads connected to circuitry on said board by a connection alloy comprising at least two constituent metals and having a given melting point less than that of either of said constituent metals. The method includes the steps of obtaining a removal alloy composed of a plurality of constituent metals and having a particular melting point below the given melting point; heating the removal alloy to a temperature greater than the particular melting point but below the given melting point so as to produce a molten state thereof; contacting the connection alloy on all of the leads with the molten removal alloy and causing thereby a reaction producing a molten state for the connection alloy; and separating the individual component from the printed circuit board while retaining thereon the other components.

20 Claims, 1 Drawing Sheet

METHOD FOR REMOVING ELECTRICAL COMPONENTS FROM PRINTED CIRCUIT BOARDS

BACKGROUND OF THE INVENTION

This invention relates generally to a method for removing components from a printed circuit board and, more particularly, to such method for removing selected surface mounted components without disturbing other components on the board.

Printed circuit boards are used widely in the electronics industry to simplify circuit assembly. Typically, such boards will retain a large number of closely spaced apart surface mounted components. When a given electrical component becomes dysfunctional, it can be economically efficient to replace only the defective component rather than the entire circuit board. However, replacement of a dysfunctional component without damaging that component or other components on the board can be difficult because of their placement in close proximity on the printed circuit board.

The most common technique used for removal of solder mounted components entails the application of heat to melt attaching solder and removal thereof with a vacuum solder "sucker". Problems associated with that technique include the generation of excessive heat, inducing mechanical strain on leads and creation of static electricity, all of which can endanger either the component being removed or adjacent components on the board. Also known are methods in which molten solder is removed by an absorbent wicking material. Examples of the wicking method are disclosed in U.S. Pat. Nos. 4,164,606 and 4,934,582. U.S. Pat. No. 3,210,182 discloses another method in which a solder bath is employed to remove all components from a printed circuit board. All such prior component removal methods have exhibited individual and collective deficiencies including high cost, use difficulty and unreliability.

The object of this invention, therefore, is to provide an improved method for reliably separating defective individual surface mounted electrical components from printed circuit boards.

SUMMARY OF THE INVENTION

The invention is a method for removing an individual surface mounted electrical component from a printed circuit board retaining a plurality of other components, the individual component having a plurality of leads connected to circuitry on the board by a connection alloy comprising at least two constituent metals and having a given melting point less than that of either of the constituent metals, and including the steps of obtaining a removal alloy composed of a plurality of constituent metals and having a particular melting point below the given melting point; heating the removal alloy to a temperature greater than the particular melting point but below the given melting point so as to produce a molten state thereof; contacting the connection alloy on all of the leads with the molten removal alloy and causing thereby a reaction producing a molten state for the connection alloy; and and separating the individual component from the printed circuit board while retaining thereon the other components. The use of a removal alloy with a relatively low melting point prevents damage to the other components.

According to one feature, the invention includes the step of removing from the printed circuit board the connection alloy and the removal alloy after the separating step. Removal of the connection and removal alloys readies the board for a replacement component.

According to other features of the invention, the two constituent metals are lead and tin, and the plurality of constituent metals include lead and tin. The separation process is facilitated by use of alloys with compatible and effective solder materials.

According to other features of the invention, the plurality of constituent metals further include bismuth and cadmium. The desired reaction with the connection alloy is enhanced by the use of bismuth and cadmium in the removal alloy.

According to yet another feature of the invention, the particular melting point is below 200° F. Damage to the separated component and other adjacent components is prevented by use of a removal alloy having a melting point below 200° F.

According to one embodiment of the invention, the heating step is performed prior to the contacting step. This embodiment is desirable for certain applications.

According to another embodiment of the invention, the contacting step is performed prior to the heating step. This embodiment is desirable for other applications.

According to still another feature of the invention, the heating step includes the steps of sequentially applying heat to the removal alloy on each of the plurality of leads. Discrete separation of an individual component is facilitated by the sequential processing of leads.

According to a further feature of the invention, the steps of sequentially applying heat are performed at a rate to produce a simultaneously molten state for the connection alloy on all of the leads. Maintaining a molten solder condition at all leads facilitates the component separation step.

According to a further feature of the invention, the steps of sequentially applying heat are performed manually with a soldering iron. Effective treatment of individual leads is enhanced by the user of a soldering iron.

According to a different feature of the invention, the steps of sequentially applying heat are performed manually with a heat gun. Collective treatment of leads is permitted by use of a heat gun.

According to an additional feature, the invention includes the step of reapplying heat to the contacting connection and removal alloys on predetermined ones of of the leads. The reapplication of heat maintains a molten state of the connection and removal alloys to facilitate separation of the individual component.

DESCRIPTION OF THE DRAWINGS

These and other objects and features of the invention will become more apparent upon a perusal of the following description taken in conjunction with the accompanying drawings wherein.

DESCRIPTION OF THE PREFERRED METHODS

Figure 1:
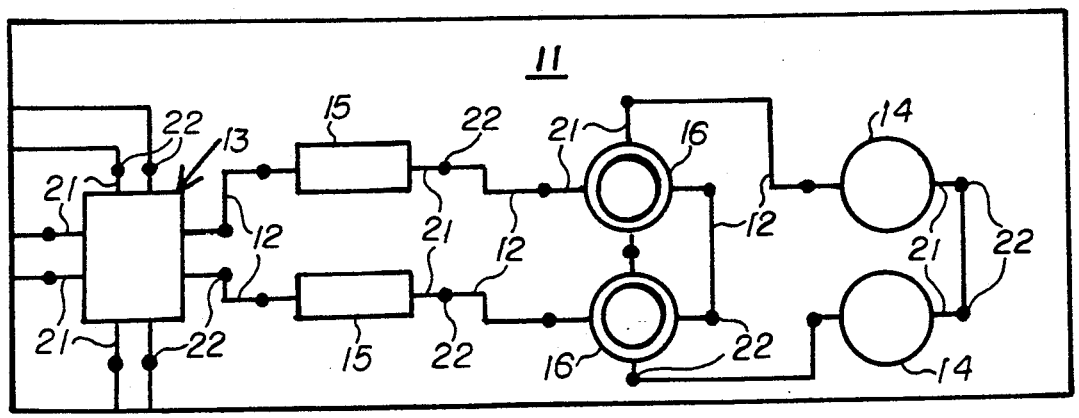
FIG. 1 is a top plan view of a printed circuit board.

Illustrated in FIG. 1 is a circuit board 11 retaining conventional printed circuitry 12. Surface mounted on the circuit board 11 are a plurality of electrical components including an integrated circuit 13, a plurality of capacitors 14, a plurality of resistors 15 and a plurality of transistors 16. Each of the electrical components 13-16 has electrical leads 21 connected to the printed circuitry 12 on the board 12 by globs 22 of a suitable electrical conductive connection alloy. The connection alloy 22 is composed of at least two constituent metals and has a given melting point less than that of either of the constituent metals. A preferred connection alloy is a lead-tin solder composed, for example, of 60% SN and 40% PB and having a given melting temperature in the range of 361° to 368° F.

In the event of an electrical failure, any individual one of the electrical components 13-16 can be removed from the circuit board 11 in accordance with the methods of this invention. By way of example, there will be described a method for separating the integrated circuit 13 from the circuit board 11, it being understood that any of the other electrical components 14-16 can be removed in the same manner.

Figure 2:
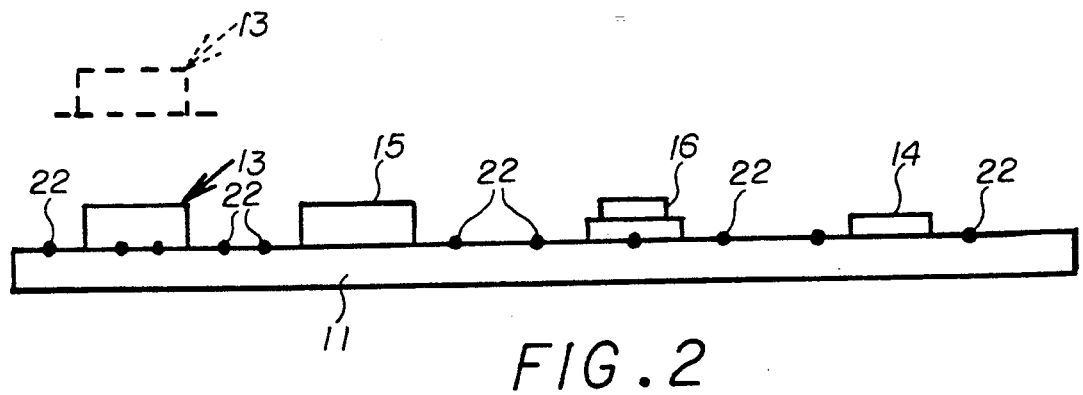
FIG. 2 is a side view of the printed circuit board shown in FIG. 1.

In accordance with the invention, a technician first obtains a quantity of a removal alloy formed from a plurality of constituent metals and having a particular melting point substantially below the given melting point of the connection alloy 22. The removal alloy which can, for example, be in the form of a wire is heated to a temperature greater than its particular melting point but below the given melting point of the connection alloy 22. Next, the connection alloy 22 on each of the leads 21 of the integrated circuit 13 are contacted by the molten removal alloy causing a reaction that also produces a molten state for the connection alloy 22. After the connection alloy 22 on each of the leads 21 has reached a molten state, the integrated circuit 13 is separated from the circuit board 11 as illustrated by dashed lines in FIG. 2. The maximum temperature produced during the separation process is substantially below the given melting temperature of the connection alloy 22 so as to prevent damage to the remaining electrical components 14-16 and facilitate reuse of the printed circuit board 11. If the circuit failure diagnosis was correct, a replacement integrated circuit 13 (not shown) then is surface mounted on the circuit board 11 and soldered in a conventional manner to the printed circuitry 12 thereby restoring the functionality of the electrical circuit board 11. However, if the separated integrated circuit tests functional, it can be replaced in an undamaged condition and a further circuit diagnosis conducted.

EXAMPLE 1

Employed in the separation process is a removal alloy wire formed from a plurality of constituent metals including 18% tin, 28% lead, 11% cadmium and 43% bismuth. An end of the removal alloy wire is moved sequentially into positions slightly above each of the leads 21 on the integrated circuit 13, and in each position the removal alloy is engaged by a conventional soldering iron producing therefor a molten state that drops onto the connection alloy 22 on the below situated lead 21. The soldering iron used produces a maximum temperature of about 170° F. which is above the particular melting point of the removal alloy but substantially below the given melting point of the connection alloy 22. As the falling, molten removal alloy successively contacts each glob of connection alloy 22, a reaction occurs that also produces a molten state thereof. This process continues at a rate such that the connection alloy 22 on each of the leads 21 remains in a molten state until all of the leads 21 have been treated. With the reacted connection alloy and removal alloy still in a molten state at each of the leads 21, the integrated circuit 13 is easily separated from the circuit board 11. In the event that an adhesive has been used to secure the integrated circuit 13 to the circuit board 11, a suitable tool such as a screwdriver can be used to pry the circuit 13 away from the board 11. After removal of the integrated circuit 13, the connection and removal alloy residue produced during the separation process is removed from the circuit board 11 manually with a conventional acid brush.

EXAMPLE 2

Another component separation process included all of the steps described above in Example 1 in addition to an additional step of utilizing a heat gun during the process to reapply heat to the contacting connection and removal alloys on predetermined ones of the leads 21 so as to maintain a molten state for the alloys until separation of the integrated circuit 13 from the circuit board 11.

EXAMPLE 3

In another surface mounted component separation process, a bead of the removal alloy described in Example 1 is placed in contact with the connection alloy 22 on each of the leads 21 of the integrated circuit 13. A conventional heat gun then is used to heat the contacting connection and removal alloys at each lead 21 to a temperature above the predetermined particular melting temperature of the removal alloy but less than the given melting temperature of the connection alloy and thereby producing a molten state therefor. The other method steps described in Example 1 then are employed to separate the integrated circuit 13 from the printed circuit board 11.

Obviously, many modifications and variations of the present invention are possible in light of the above teachings. It is to be understood, therefore, that the invention can be practiced otherwise than as specifically described.

What is claimed is:

1. A method of removing an individual surface mounted electrical component from a printed circuit board retaining a plurality of other components, said individual component having a plurality of leads connected to circuitry on said board by a connection alloy comprising at least two constituent metals and having a given melting point less than that of either of said constituent metals, and comprising the steps of:

obtaining a removal alloy comprising a plurality of constituent metals and having a particular melting point below said given melting point;

heating said removal alloy to a temperature greater than said particular melting point but below said given melting point so as to produce a molten state thereof;

sequentially contacting said connection alloy on each of said leads with said molten removal alloy and causing thereby a reaction producing a molten state for said connection alloy; and separating said individual component from said printed circuit board while retaining thereon said other components.

2. A method according to claim 1 including the step of removing from said printed circuit board said connection alloy and said removal alloy after said separating step.

3. A method according to claim 1 wherein said particular melting point is below 200° F.

4. A method according to claim 1 wherein said heating step is prior to said contacting step.

5. A method according to claim 1 wherein said contacting step is prior to said heating step.

6. A method according to claim 1 wherein said individual components are mounted on one surface of said circuit board, and said connection alloy is contacted by said removal alloy on said one surface of said circuit board.

7. A method according to claim 1 wherein said steps of sequentially applying heat are performed at a rate to produce a simultaneously molten state for said connection alloy on all of said leads.

8. A method according to claim 7 wherein said steps of sequentially applying heat are performed manually with a soldering iron.

9. A method according to claim 7 wherein said steps of sequentially applying heat are performed manually with a heat gun.

10. A method according to claim 7 including the step of reapplying heat to said contacting connection and removal alloys on predetermined ones of said leads so as to maintain said molten state of said connection and removal alloys.

11. A method according to claim 10 wherein said reapplying steps are performed manually with a heat gun.

12. A method according to claim 11 wherein said steps of sequentially applying heat are performed manually with a soldering iron.

13. A method according to claim 7 including the step of removing from said printed circuit board said connection alloy and said removal alloy after said separating step.

14. A method according to claim 13 wherein said at least two constituent metals are lead and tin.

15. A method according to claim 14 wherein said plurality of constituent metals comprise lead and tin.

16. A method according to claim 15 wherein said plurality of constituent metals further comprises bismuth and cadmium.

17. A method according to claim 13 wherein said removing step comprises manually brushing said connection alloy and said removal alloy from said printed circuit board.

18. A method of removing a plurality of individual surface mounted electrical components from a printed circuit board retaining a plurality of other components, each of said individual components having a plurality of leads connected to circuitry on said board by a connection alloy comprising at least two constituent metals and having a given melting point less than that of either of said constituent metals, and comprising the steps of:
obtaining a removal alloy comprising a plurality of constituent metals and having a particular melting point below said given melting point;
heating said removal alloy to a temperature greater than said particular melting point but below said given melting point so as to produce a molten state thereof;
sequentially contacting said connection alloy on each of said individual components with said molten removal alloy and causing thereby a reaction producing a molten state for said connection alloy; and
sequentially separating said individual components from said printed circuit board while retaining thereon said other components.

19. A method according to claim 18 wherein said individual components are mounted on one surface of said circuit board, and said connection alloy is contacted by said removal alloy on said one surface of said circuit board.

20. A method according to claim 18 wherein said heating step comprises the steps of sequentially applying heat to said removal alloy on each of said plurality of leads.

* * * * *